United States Patent
Liu

(10) Patent No.: US 6,549,474 B2
(45) Date of Patent: Apr. 15, 2003

(54) METHOD AND CIRCUIT FOR REGULATING THE OUTPUT VOLTAGE FROM A CHARGE PUMP CIRCUIT, AND MEMORY DEVICE USING SAME

(75) Inventor: Tz-yi Liu, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/046,338

(22) Filed: Oct. 26, 2001

(65) Prior Publication Data

US 2002/0093854 A1 Jul. 18, 2002

Related U.S. Application Data

(63) Continuation of application No. 09/256,972, filed on Feb. 24, 1999, now Pat. No. 6,320,797.

(51) Int. Cl.[7] .................................................. G11C 7/00

(52) U.S. Cl. ............................ 365/189.11; 365/189.09; 365/226; 365/189.05

(58) Field of Search ........................... 365/189.11, 226, 365/189.5, 189.09; 307/110; 363/60; 327/306, 536

(56) References Cited

U.S. PATENT DOCUMENTS

| | | | |
|---|---|---|---|
| 4,720,815 A | 1/1988 | Ogawa | 365/78 |
| 4,935,644 A | 6/1990 | Tsujimoto | 307/296.2 |
| 5,029,063 A | 7/1991 | Lingstaedt et al. | 363/60 |
| 5,038,325 A | 8/1991 | Douglas et al. | 365/189.06 |
| 5,184,035 A | 2/1993 | Sugibayashi | 307/482 |
| 5,237,209 A * | 8/1993 | Brewer | 307/110 |

(List continued on next page.)

OTHER PUBLICATIONS

Choi et al., "Floating-Well Charge Pump Circuits for Sub-2.0V Single Power Supply Flash Memories," in *Symposium on VLSI Circuits Digest of Technical Papers*, Memory Division, Samsung Electronics Co., Ltd, Kiheung, Korea, pp. 61–62, 1997.

(List continued on next page.)

*Primary Examiner*—Richard Elms
*Assistant Examiner*—Tuan T. Nguyen
(74) *Attorney, Agent, or Firm*—Dorsey & Whitney LLP

(57) ABSTRACT

A charge pump circuit is regulated to provide a pumped output voltage having reduced voltage ripple. The charge pump circuit generates a boosted output voltage, and includes a plurality of charge pump stages coupled in series, each including an input terminal, an output terminal, a clock terminal, a capacitor, and a switch. The capacitor of each charge pump stage is coupled between the clock terminal and the input terminal, and the switch of each charge pump stage is coupled between the input terminal and the output terminal. The input terminal of a first charge pump stage in the series is coupled to a voltage source and the output terminal of a last charge pump stage in the series is coupled to a pumped voltage output terminal. The switches of all charge pump stages but the last charge pump stage are selectively closed to allow current to flow in a first direction and selectively opened to prevent current flow in a second direction that is opposite the first direction. The switch of the last charge pump stage has a control input that is coupled to a control terminal. A clocking circuit applies first and second complementary digital signals to the clock terminals of the respective charge pump stages with the charge pump stages that receive the first digital signal alternating with the charge pump stages that receive the second digital signal. A control circuit applies a control signal to the control terminal to allow current to flow in the first direction when the absolute value of a pumped voltage at the pumped voltage output terminal has a magnitude that is less than a predetermined value and to prevent current from flowing in the first direction when the absolute value of the pumped voltage at the pumped voltage output terminal has a magnitude that is greater than the predetermined value.

25 Claims, 4 Drawing Sheets

U.S. PATENT DOCUMENTS

| | | | | |
|---|---|---|---|---|
| 5,306,954 A | * | 4/1994 | Chan et al. | 307/110 |
| 5,341,334 A | | 8/1994 | Maruyama | 365/189.11 |
| 5,363,066 A | | 11/1994 | Chen et al. | 331/17 |
| 5,426,333 A | | 6/1995 | Maeda | 327/536 |
| 5,524,266 A | * | 6/1996 | Tedrow et al. | 327/306 |
| 5,535,160 A | | 7/1996 | Yamaguchi | 365/189.01 |
| 5,642,073 A | * | 6/1997 | Manning | 327/536 |
| 5,650,671 A | * | 7/1997 | Pascucci et al. | 307/110 |
| 5,699,313 A | | 12/1997 | Foss et al. | 365/226 |
| 5,760,497 A | * | 6/1998 | Pascucci | 307/110 |
| 5,870,295 A | | 2/1999 | Watanabe | 363/60 |
| 5,940,284 A | | 8/1999 | Troutman | 363/60 |
| 5,986,947 A | | 11/1999 | Choi et al. | 365/189.11 |
| 6,026,003 A | | 2/2000 | Moore et al. | 363/60 |
| 6,034,562 A | * | 3/2000 | Bonet et al. | 327/530 |
| 6,118,329 A | | 9/2000 | Jin | 327/536 |
| 6,160,723 A | * | 12/2000 | Liu | 327/536 |
| 6,255,886 B1 | * | 7/2001 | Manning | 327/321 |
| 6,373,753 B1 | * | 4/2002 | Proebsting | 365/189.09 |

OTHER PUBLICATIONS

Kawahara et al., "Bit–Line Clamped Sensing Muliplex and Accurate High Voltage Generator for Quarter–Micron Flash Memories," in *IEEE Journal of Solid State Circuits*, vol. 31, No. 11, pp. 1590–1600, Nov. 1996.

Mihara et al., "Negative Heap Pump for Low Voltage Operation Flash Memory," in *Symposium on VLSI Circuits Digest of Technical Papers*, USLI Laboratory, Mitsubishi Electric Corporation, Hyogo Japan, pp. 76–77, 1996.

Sawada et al., An On–Chip High–Voltage Genreator Circuit for EEPROMs with a Power Supply Voltage below 2V, in *Symposium on VLSI Circuits Digest of Technical Papers*, Nippon Steel Corporation, Kanagawa, Japan, pp. 75–76, 1995.

Tanzawa et al., "Circuit Technologies for a Single–1.8V Flash Memory," in *Symposium on VLSI Circuits Digest of Technical Papers*, Microelectronics Engineering Laboratory, Toshiba Corporation, Yokohama, Japan, pp. 63–64, 1997.

Wang et al., "Efficiency Improvement in Charge Pump Circuits," in *IEEE Journal of Solid State Circuits*, vol. 32, No. 6, pp. 852–860, Jun. 1997.

Wu et al., "Low Supply Voltage CMOS Charge Pumps," in *Symposium on VLSI Circuits Digest of Technical Papers*, Department of Electronics Engineering and Macronix International Co. Ltd., Hsin–Shu, Taiwan, pp. 81–82, 1997.

Wu et al., "1.2V CMOS Switched–Capacitor Circuits," in *ISSCC96 Session* 24 *Dialog Techniques Paper SP* 24.4.

256k X 8 Boot Block Flash Memory, in Micron Quantum Devices, Inc., pp. 1–1 through 1–27, 1997.

* cited by examiner

METHOD AND CIRCUIT FOR REGULATING THE OUTPUT VOLTAGE FROM A CHARGE PUMP CIRCUIT, AND MEMORY DEVICE USING SAME

CROSS-REFERENCE TO RELATED APPLICATION

This application is a continuation of U.S. patent application Ser. No. 09/256,972, filed Feb. 24, 1999, now U.S. Pat. No. 6,320,797.

TECHNICAL FIELD

The present invention relates to voltage generating circuits, and, more particularly, to a method and circuit for regulating a charge pump circuit to minimize the ripple and the power consumption of the charge pump circuit.

BACKGROUND OF THE INVENTION

In many electronic circuits, charge pump circuits are utilized to generate a positive pumped voltage having an amplitude greater than that of a positive supply voltage, or to generate a negative pumped voltage from the positive supply voltage, as understood by those skilled in the art. For example, in a conventional dynamic random access memory ("DRAM"), a charge pump circuit may be utilized to generate a boosted word line voltage $V_{CCP}$ having an amplitude greater than the amplitude of a positive supply voltage $V_{CC}$, and a negative voltage pump circuit may be utilized to generate a negative substrate or back-bias voltage $V_{bb}$ that is applied to the bodies of NMOS transistors in the DRAM. Another typical application of a charge pump circuit is the generation of a high voltage utilized to erase data stored in blocks of memory cells or to program data into memory cells in non-volatile electrically block-erasable or "FLASH" memories, as will be understood by those skilled in the art.

FIG. 1 is a schematic of a conventional two-stage charge pump circuit 100 that generates a pumped output voltage $V_P$ having an amplitude greater than the amplitude of a supply voltage source $V_{CC}$ in response to complementary clock signals CLK and $\overline{CLK}$, as will be described in more detail below. The charge pump circuit 100 includes two voltage-boosting stages 102 and 104 connected in series between an input voltage node 106 and an output voltage node 108. The voltage-boosting stage 102 includes a capacitor 110 receiving the clock signal CLK on a first terminal and having a second terminal coupled to the input node 106. A diode-coupled transistor 112 is coupled between the input voltage node 106 and a voltage node 114, and operates as a unidirectional switch to transfer charge stored on the capacitor 110 to a capacitor 116 in the second voltage-boosting stage 104. The capacitor 116 is clocked by the complementary clock signal $\overline{CLK}$. A transistor 118 transfers charge stored on the capacitor 116 to a load capacitor $C_L$ when the transistor 118 is activated. A threshold voltage cancellation circuit 122 generates a boosted gate signal $V_{BG}$ responsive to the CLK and $\overline{CLK}$ signals, and applies the signal $V_{BG}$ to control activation of the transistor 118. When the CLK and $\overline{CLK}$ signals are high and low, respectively, the circuit 122 drives the signal $V_{BG}$ low to turn OFF the transistor 118, and when the CLK and $\overline{CLK}$ signals are low and high, respectively, the circuit 122 drives the signal $V_{BG}$ high to turn ON the transistor 118. The cancellation circuit 122 may be formed from conventional circuitry that is understood by those skilled in the art. The charge pump circuit 100 further includes a diode-coupled transistor 120 coupled between the supply voltage source $V_{CC}$ and node 106. The diode-coupled transistor 120 operates as a unidirectional switch to transfer charge from the supply voltage source $V_{CC}$ to the capacitor 110.

A ring oscillator 124 generates an oscillator clock signal OCLK that is applied to a switching circuit 126 coupled between the ring oscillator 124 and a clocking-latching circuit 128. The switching circuit 126 receives a regulation output signal REGOUT from external control circuitry (not shown in FIG. 1), and when the REGOUT signal is inactive low, the switching circuit 126 presents a low impedance and thereby applies the OCLK signal to the clocking-latching circuit 128. When the REGOUT signal is active high, the switching circuit 126 presents a high impedance, which isolates or removes the OCLK signal from the clocking-latching circuit 128. The clocking-latching circuit 128 latches the applied OCLK signal and generates the complementary clock signals CLK and $\overline{CLK}$ responsive to the latched OCLK signal. The CLK and $\overline{CLK}$ signals have the same frequency as the OCLK signal, and are complementary signals so there is a phase shift of 180° between these signals.

The operation of the conventional charge pump circuit 100 will now be described in more detail with reference to the timing diagram of FIG. 2, which illustrates the voltages at various points in the charge pump circuit 100 during operation. In operation, the charge pump circuit 100 operates in two modes, a normal mode and a power-savings mode. During both the normal and power-savings modes of operation, the ring oscillator 124 continuously generates the OCLK signal. The charge pump circuit 100 operates in the normal mode when the pumped output voltage $V_P$ is less than a desired pumped output voltage $V_{PD}$. When $V_P < V_{PD}$, the external control circuitry drives the REGOUT signal inactive low causing the switching circuit 126 to apply the OCLK signal to the clocking-latching circuit 128. In response to the applied OCLK signal, the clocking-latching circuit 128 latches the OCLK and clocks the stages 102 and 104 with the CLK and $\overline{CLK}$ signals generated in response to the latched OCLK signal.

At just before a time $t_0$, the CLK signal is low having a voltage of approximately 0 volts and the $\overline{CLK}$ signal is high having a voltage of approximately the supply voltage $V_{CC}$, and each of the voltages on the nodes 106, 114, and 108 and the have assumed values as shown for the sake of example. Also, before the time $t_0$ the REGOUT signal is inactive low and the circuit 122 drives the boosted gate signal $V_{BG}$ high responsive to the CLK and $\overline{CLK}$ signals being low and high, respectively. When the CLK signal is low, the terminal of the capacitor 110 is accordingly at approximately ground and the voltage at the node 106 is sufficiently low to turn ON the diode-coupled transistor 120, transferring charge from the supply voltage source VCC through the transistor 120 to charge the capacitor 110. As shown in FIG. 2, the voltage at the node 106 (i.e., the voltage across the capacitor 110) is increasing just before the time $t_0$ as the capacitor 10 is being charged. Also just before the time $t_0$, the voltage at the node 114 equals the high voltage of the $\overline{CLK}$ signal plus the voltage stored across the capacitor 116 ($V_{116}$). This boot-strapped voltage on the node 114 is sufficiently greater than the voltage $V_P$ on the output voltage node 108 to turn ON the transistor 118, transferring charge from the capacitor 116 through the transistor 118 to the load capacitor $C_L$. As shown, the voltage at node 114 is decreasing and the voltage $V_P$ increasing just before the time $t_0$ as charge is being transferred through the transistor 118.

At the time $t_0$, the CLK signal goes high, driving the voltage on the node 106 to the high voltage ($V_{CC}$) of the CLK signal plus the voltage stored across the capacitor 110 ($V_{110}$). At this point, the voltage on the node 106 is sufficiently high to turn OFF the transistor 120, isolating the node 106 from the supply voltage source $V_{CC}$. Also at the time $t_0$, the $\overline{CLK}$ signal goes low (to ground), causing the voltage on the node 114 to equal the voltage $V_{116}$ stored across the capacitor 116. The voltage on the node 106 is now sufficiently greater than the voltage on the node 114 to turn ON the transistor 112, transferring charge from the capacitor 110 through the transistor 112 to the capacitor 116. As shown in FIG. 2, between the time $t_0$ and a time $t_1$, which corresponds to the interval the CLK signal is high and $\overline{CLK}$ signal is low, the voltage at the node 106 decreases and the voltage at the node 114 increases as charge is pumped or transferred through the transistor 112. It should be noted that during this time, the transistor 118 is turned OFF because the voltage $V_P$ is sufficiently greater than the voltage at the node 114 during normal operation of the charge pump circuit 100.

At the time $t_1$, the CLK and $\overline{CLK}$ signals go low and high, respectively, and the charge pump circuit 100 operates in the same manner as previously described for just before the time $t_0$. In other words, the transistor 112 turns OFF and transistors 118 and 120 turn ON, and charge is transferred from the supply voltage source $V_{CC}$ through the transistor 120 to the capacitor 110 and charge is transferred from the capacitor 116 through the transistor 118 to the load capacitor $C_L$. As seen in FIG. 2, from the time $t_1$ to a time $t_2$ the voltage at the node 106 increases as the capacitor 110 is charging and the voltages on nodes 114 and 108 decrease and increase, respectively, as charge is transferred from the capacitor 116 to the load capacitor $C_L$. At the time $t_2$, the CLK and $\overline{CLK}$ signals again go high and low, respectively, and the charge pump circuit 100 operates as previously described at the time $t_0$.

The charge pump circuit 100 continues operating in this manner during the normal mode, pumping charge from the supply voltage source $V_{CC}$ to the successive capacitors 110, 116, and $C_L$ to develop the desired pumped voltage $V_{PD}$ across the capacitor $C_L$. When the pumped output voltage $V_P$ becomes greater than the desired voltage $V_{PD}$, the charge pump circuit 100 commences operation in the power-savings mode of operation, which occurs at a time $t_3$ in FIG. 2. In response to the pumped output voltage $V_P$ becoming greater than the desired voltage $V_{PD}$, the external control circuit drives the REGOUT signal active high, causing the switching circuit 126 to present a high impedance so that the OCLK signal no longer clocks the clocking-latching circuit 128 which, in turn, no longer clocks the voltage-boosting stages 102 and 104. As a result, the CLK and $\overline{CLK}$ signals remain in their previous latched states until the pumped output voltage $V_P$ is less than $V_{PD}$. This is seen in the example of FIG. 2 at a time $t_4$ when, although the OCLK signal goes high, the CLK and $\overline{CLK}$ signals remain low and high, respectively, since OCLK signal is not applied to the clocking-latching circuit 128.

Once the pumped output voltage $V_P$ becomes less than $V_{PD}$, the control circuit drives the REGOUT signal inactive low and the charge pump circuit 100 again commences operation in the normal mode. As will be understood by those skilled in the art, the switching circuit 126 enables the charge pump circuit 100 to very quickly switch into the normal mode of operation since the ring oscillator 124 continually generates the OCLK signal. In other words, since the ring oscillator 124 continuously generates the OCLK signal, transition from the power-savings to normal mode is delayed only by the switching time of the circuit 126, which is very fast. In contrast, if the ring oscillator 124 was turned ON and OFF responsive to the REGOUT signal, the settling time (i.e., the time for the CLK, $\overline{CLK}$ signals to stabilize) of the oscillator when turned back ON is much greater than the switching time of the circuit 126. As a result, in this situation the voltage $V_P$ could continue to decrease during this settling time, thereby increasing the ripple of the voltage $V_P$.

The power-savings mode of operation reduces the overall power consumption of the circuit 100 since the CLK and $\overline{CLK}$ signals do not clock the stages 102 and 104 when the voltage $V_P$ is greater than the desired voltage $V_{PD}$. Although the overall power consumption of the circuit 100 is reduced and the switching circuit 126 alleviates some of the ripple introduced by switching between modes, operation in the power-savings mode introduces additional ripple of the pumped output voltage $V_P$ due to the transistor 118 in the final voltage-boosting stage 104 remaining turned ON during this mode of operation. More specifically, when the charge pump circuit 100 enters the power savings mode of operation the CLK and $\overline{CLK}$ signals have one of two states. If the CLK and $\overline{CLK}$ signals are high and low, respectively, when the REGOUT signal goes active to enter the power-savings mode, then the boosted gate signal $V_{BG}$ remains low during this mode and the transistor 118 is turned OFF. In this situation, the turned OFF transistor 118 isolates the output node 108 and the voltage $V_P$ is not affected by the voltage on the node 114.

In contrast, if the CLK and $\overline{CLK}$ signals are low and high, respectively, when the REGOUT signal goes active, the transistor 118 may remain turned ON during the power-savings mode thereby coupling the output node 108 to the node 114. As a result, the voltage on the node 114 affects the pumped output voltage $V_P$ in this situation. For example, as illustrated in FIG. 2, it is seen that when the REGOUT signal goes high at the time $t_3$ the CLK and $\overline{CLK}$ signals are low and high, respectively, so the signal $V_{BG}$ is high turning ON the transistor 118. As seen after the time $t_3$, the pumped output voltage $V_P$ continues to increase as charge is transferred from the capacitor 116 through the transistor 118 to the load capacitor $C_L$. Thus, the pumped voltage $V_P$ undesirably increases after time $t_3$ even though it is already greater than the desired voltage $V_{PD}$, thereby increasing the ripple of the pumped output voltage.

There is a need for a charge pump circuit having a low power consumption and a reduced ripple of the generated pumped output voltage.

SUMMARY OF THE INVENTION

According to one aspect of the present invention, a charge pump circuit includes a plurality of charge pump stages coupled in series, each including an input terminal, an output terminal, a clock terminal, a capacitor, and a switch. The capacitor of each charge pump stage is coupled between the clock terminal and the input terminal, and the switch of each charge pump stage is coupled between the input terminal and the output terminal. The input terminal of a first charge pump stage in the series is coupled to a voltage source and the output terminal of a last charge pump stage in the series is coupled to a pumped voltage output terminal. The switches of all charge pump stages but the last charge pump stage are selectively closed to allow current to flow in a first direction and selectively opened to prevent current flow in a second direction that is opposite the first direction. The switch of the last charge pump stage has a control input that is coupled to a control terminal. A clocking circuit applies first and second complementary digital signals to the clock terminals of the respective charge pump stages with the charge pump stages that receive the first digital signal alternating with the charge pump stages that receive the second digital signal. A control circuit applies a control signal to the control terminal to allow current to flow in the first direction when the absolute value of a pumped voltage at the pumped voltage output terminal has a magnitude that is less than a predetermined value and to prevent current from flowing in the first direction when the absolute value of the pumped voltage at the pumped voltage output terminal has a magnitude that is greater than the predetermined value.

DETAILED DESCRIPTION OF THE INVENTION

Figure 3:
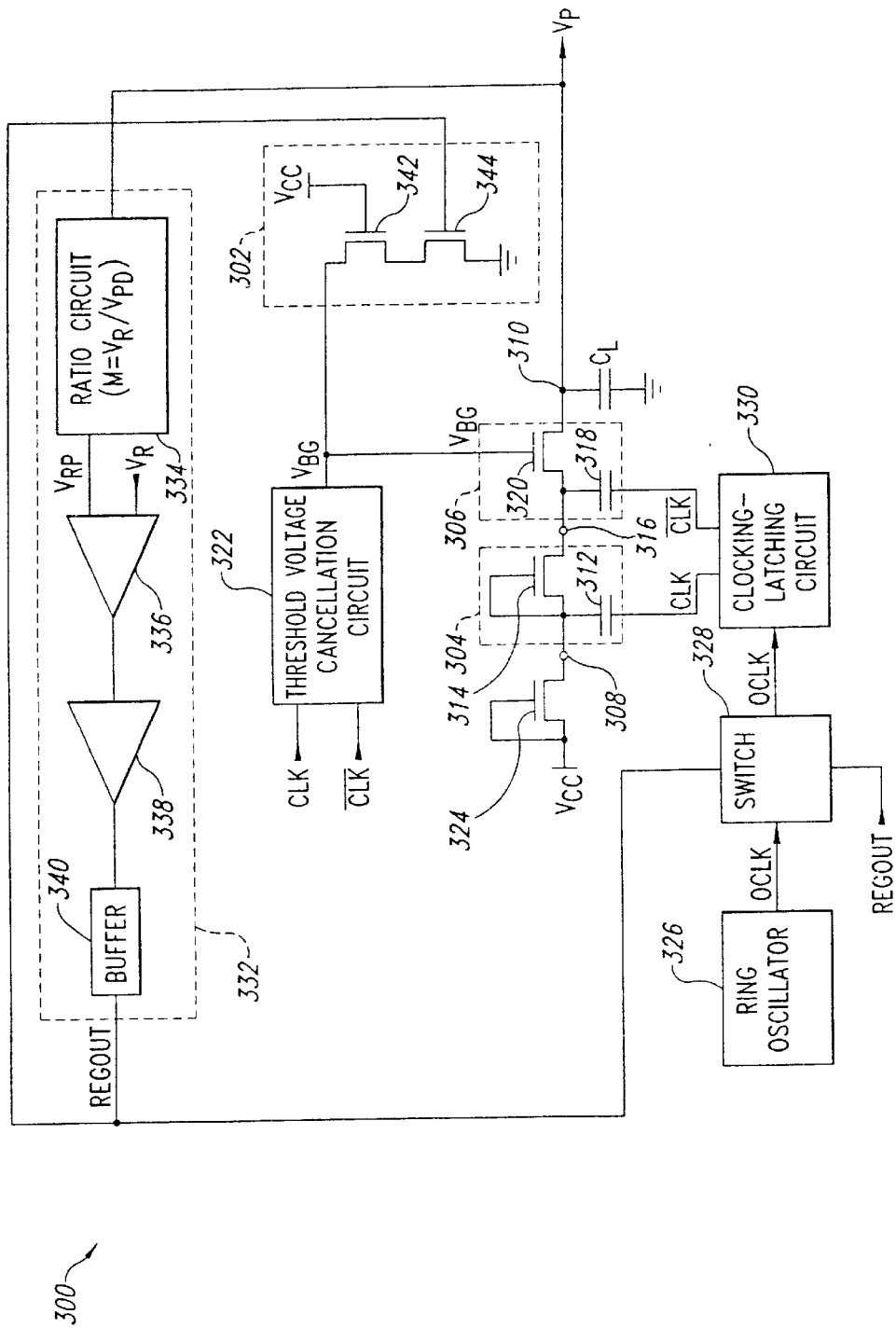
FIG. 3 is a schematic illustrating a charge pump circuit according to one embodiment of the present invention.

FIG. 3 is a schematic of a charge pump circuit 300 including an isolation circuit 302 according to one embodiment of the present invention. The charge pump circuit 300 includes two voltage-boosting stages 304 and 306 connected in series between an input node 308 and an output node 310. In operation, the isolation circuit 302 operates during a power-savings mode to turn OFF the final voltage-boosting stage 306 when a pumped output voltage $V_P$ on the node 310 exceeds a desired value. By turning OFF the final voltage-boosting stage 306, the isolation circuit 302 isolates the output node 310 so that the final voltage-boosting stage 306 does not increase the ripple of the pumped output voltage $V_P$ during the power-savings mode, as will be explained in more detail below.

In the charge pump circuit 300, the voltage-boosting stage 304 includes a capacitor 312 receiving a clock signal CLK on a first terminal and having a second terminal coupled to the input node 308. An NMOS diode-coupled transistor 314 is coupled between the input node 308 and a voltage node 316, and operates as a unidirectional switch to transfer charge stored on the capacitor 312 to a capacitor 318 in the final voltage-boosting stage 306. The capacitor 318 receives a complementary clock signal $\overline{CLK}$, and charge stored on the capacitor 318 is transferred through an NMOS transistor 320 to a load capacitor $C_L$ when the transistor 320 is activated. A threshold voltage cancellation circuit 322 generates a boosted gate signal $V_{BG}$ responsive to the CLK and $\overline{CLK}$ signals, and applies the signal $V_{BG}$ to control activation of the transistor 320. When the CLK and $\overline{CLK}$ signals are high and low, respectively, the cancellation circuit 322 drives the signal $V_{BG}$ low turning OFF the transistor 320, and when the CLK and $\overline{CLK}$ signals are low and high, respectively, the circuit 322 drives the signal $V_{BG}$ high turning ON the transistor 320. The charge pump circuit 300 further includes a diode-coupled transistor 324 coupled between a supply voltage source $V_{CC}$ and the input node 308. The diode-coupled transistor 324 operates as a unidirectional switch, transferring charge from the supply voltage source $V_{CC}$ to the capacitor 312. Transistors 324 and 314 are not necessarily in diode-coupled configuration. The gate voltage of these transistors can be generated from other threshold voltage cancellation circuit.

Figure 1:
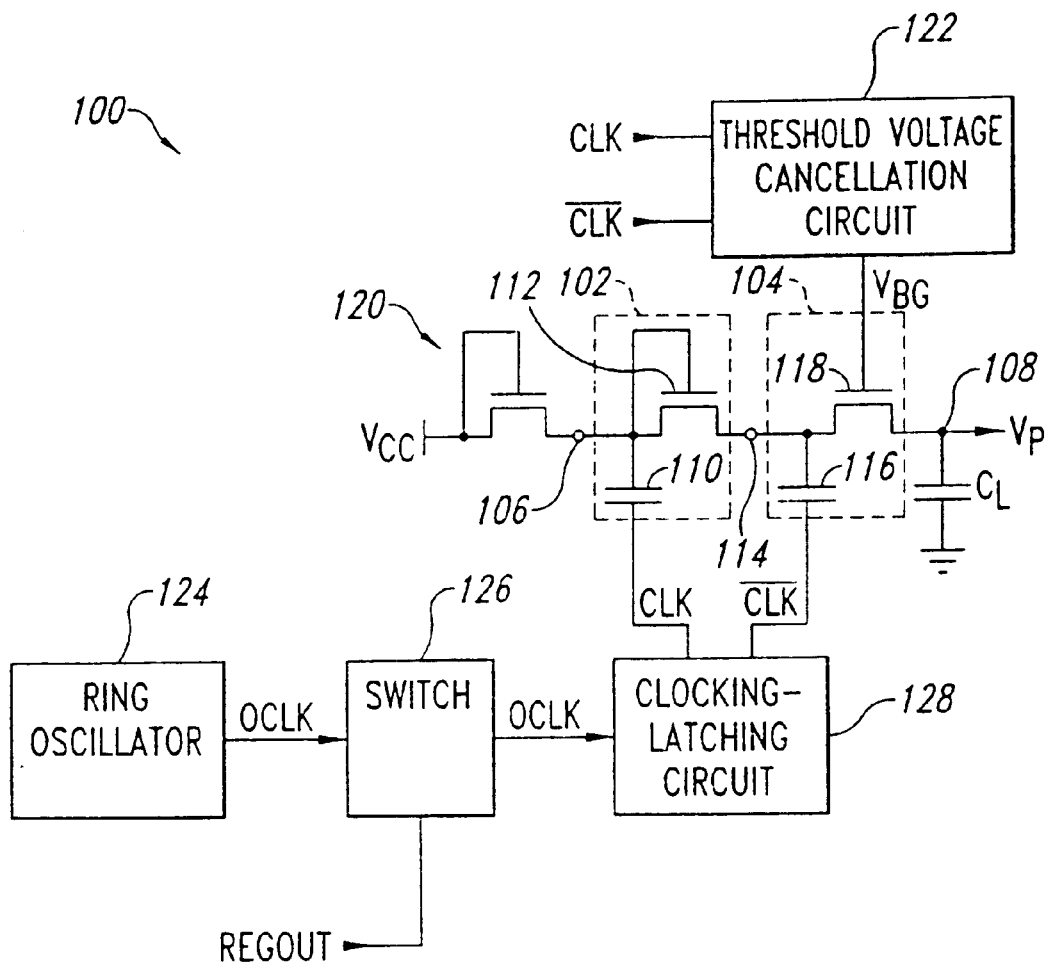
FIG. 1 is a schematic of a conventional charge pump circuit.
Figure 2:
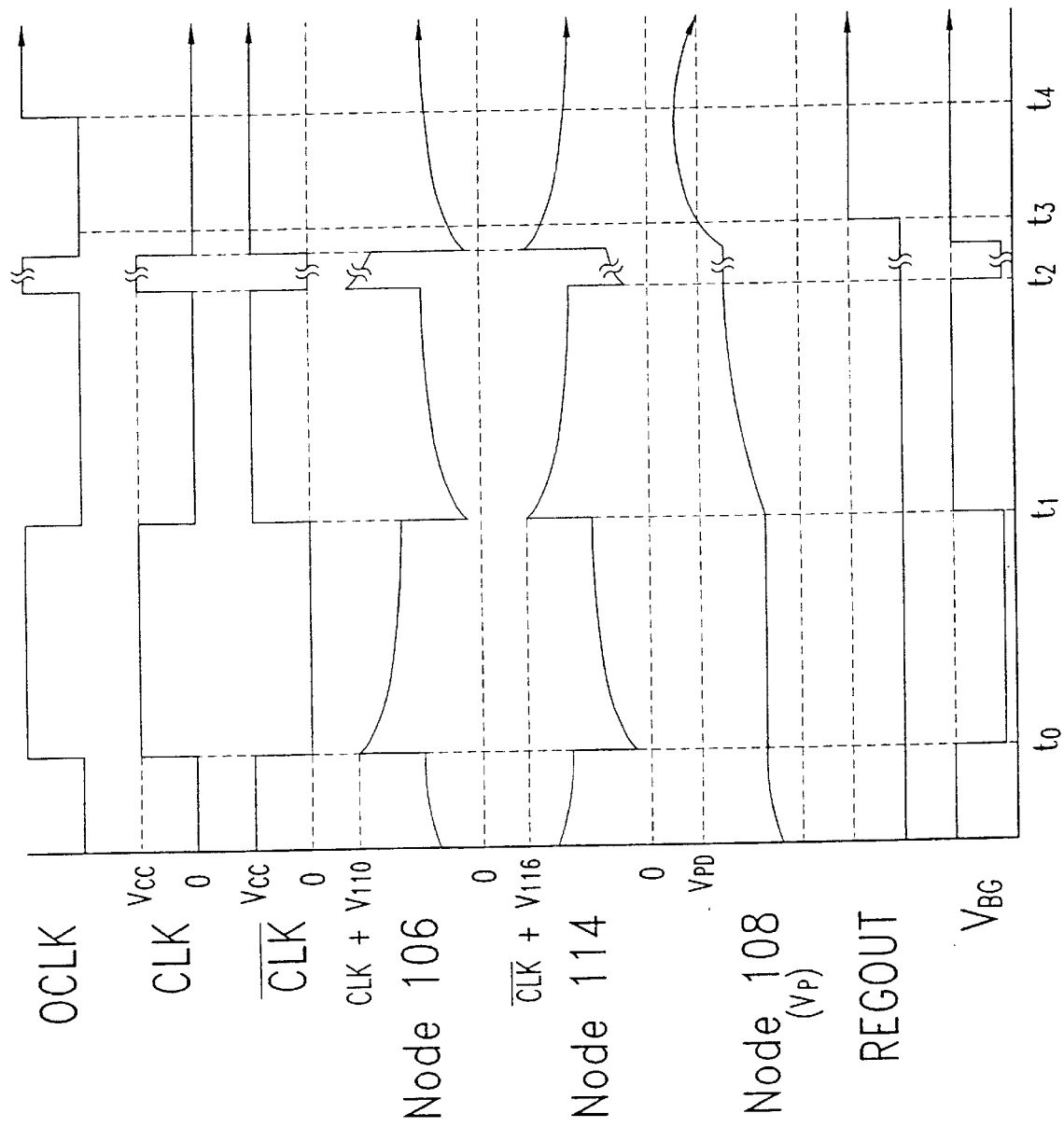
FIG. 2 is a signal diagram illustrating the operation of the charge pump circuit of FIG. 1.

A ring oscillator 326 generates an oscillator clock signal OCLK that is applied to a switching circuit 328 coupled between the ring oscillator 326 and a clocking-latching circuit 330. The switching circuit 328 receives a regulation output signal REGOUT from a feedback control circuit 332. The ring oscillator 326, switching circuit 328, and clocking-latching circuit 330 operate identically to the corresponding components previously described with reference to FIG. 1, and thus, for the sake of brevity, their operation will not again be described in detail. Moreover, one skilled in the art will understand circuitry that performs the required functions of the ring oscillator 326 and circuits 328 and 330. For example, the switching circuit 328 may be a conventional transmission gate, the clocking-latching circuit 330 may include a conventional RS flip-flop circuit and buffer circuitry, and the ring oscillator 326 may be formed from a plurality of inverters connected in series with the output from the last inverter being applied to the input of the first inverter, as will be understood by those skilled in the art.

The feedback control circuit 332 generates the REGOUT signal in response to the pumped output voltage $V_P$ generated on the output node 310. When the voltage $V_P$ is greater than a desired value, the feedback control circuit 332 drives the REGOUT signal active high, causing the switching circuit 328 to isolate the OCLK signal from the clocking-latching circuit 330. In contrast, when the pumped output voltage $V_P$ is less than the desired value, the feedback control circuit 332 drives the REGOUT signal inactive low, causing the switching circuit 328 to apply the OCLK signal to the clocking-latching circuit 330. In the embodiment of FIG. 3, the feedback control circuit 332 includes a ratio circuit 334 that generates a ratio voltage $V_{RP}$ having a value that is equal to the actual pumped output voltage $V_P$ times a gain M. The gain M of the ratio circuit 334 is defined by the value of a reference voltage $V_R$ divided by the desired value of the pumped output voltage on the node 310, which is designated $V_{PD}$. The gain M of the ratio circuit 334 functions to scale the pumped output voltage $V_P$ such that when the pumped output voltage has the desired value $V_{PD}$, the ratio voltage $V_{RP}$ equals the reference voltage $V_R$. One skilled in the art will understand circuitry that can be used to form the ratio circuit 334, such as two resisters connected in a voltage divider with a capacitor in parallel with each resistor.

A comparator 336 then compares the ratio voltage $V_{RP}$ from the ratio circuit 334 to the reference voltage $V_R$ and generates an output in response to this comparison. During operation of the charge pump circuit 300, the actual pumped output voltage $V_P$ typically has a value that is either less than or greater than the desired pumped output voltage $V_{PD}$. As a result, the ratio voltage $V_{RP}$ will be either less than or greater than the reference voltage $V_R$. The ratio voltage $V_{RP}$ is greater than the reference voltage when the pumped voltage $V_P$ is greater than the desired voltage $V_{PD}$, causing the comparator 336 to drive its output active high. In contrast, when the ratio voltage $V_{RP}$ is less than the reference voltage $V_R$, indicating the pumped voltage $V_P$ is less than the desired voltage $V_{PD}$, the comparator 336 drives its output inactive low. The output of the comparator 336 is applied through an amplifier 338 to a buffer 340 that generates the REGOUT signal responsive to the amplified output from the amplifier 338. When the output from the comparator 336 is active high, the buffer 340 receives this amplified output from the amplifier 338 and drives the REGOUT signal active high. If the output from the comparator 336 is inactive low, the buffer 340 receives this amplified output from the amplifier 338 and drives the REGOUT signal inactive low.

In the charge pump circuit 300, the REGOUT signal from the feedback control circuit 332 is further applied to the isolation circuit 302. The isolation circuit 302 is coupled to the gate of the transistor 320 in the final voltage-boosting stage 306. When the REGOUT signal is inactive low, the isolation circuit 302 presents a high impedance to the gate of the transistor 320 and thus the voltage on the gate is determined by the boosted gate signal $V_{BG}$ from the cancellation circuit 322. When the REGOUT signal is active high, the isolation circuit 302 turns ON, coupling the gate of the transistor 320 to approximately ground to thereby turn OFF the transistor 320. In the embodiment of FIG. 3, the isolation circuit 302 includes a load transistor 342 and an enable transistor 344 connected in series between the gate of the transistor 320 and ground as shown. The enable transistor 344 receives the REGOUT signal from the feedback control circuit 332, turning ON and OFF when the REGOUT signal is high and low, respectively.

In operation, the charge pump circuit 300 operates in two modes, a normal mode and a power-savings mode. During both the normal and power-savings modes of operation, the ring oscillator 326 continuously generates the OCLK signal. In the following description, the means by which each of the voltage-boosting stages 304 and 306 boosts the corresponding voltage is substantially the same as in the charge pump circuit 100 previously described with reference to FIG. 1, and thus for the sake of brevity will not be described in more detail. Instead, the following description will explain the operation of the feedback control circuit 332 and isolation circuit 302 in reducing the voltage ripple of the pumped output voltage $V_P$ generated by the charge pump circuit 300.

The charge pump circuit 300 operates in the normal mode when the pumped output voltage $V_P$ is less than the desired pumped output voltage $V_{PD}$. When the actual pumped output voltage $V_P$ is less than the desired voltage $V_{PD}$, the ratio circuit 334 develops the ratio voltage $V_{RP}$ having a value that is less than the reference voltage $V_R$, causing the comparator 336 to drive its output inactive low. In response to the low output from the comparator 336, the amplifier 338 applies the amplified low output to the buffer 340 which, in turn, drives the REGOUT signal inactive low. In response to the low REGOUT signal, the transistor 344 turns OFF causing the isolation circuit 302 to present a very high impedance to the gate of the transistor 320. In this situation, the value of the boosted gate signal $V_{BG}$ from the cancellation circuit 322 controls the operation of the transistor 320. The low REGOUT signal also causes the switching circuit 328 to present a low impedance, thereby applying the OCLK signal from the ring oscillator 326 to the clocking-latching circuit 330 which, in turn, clocks the voltage-boosting stages 304 and 306 with the CLK and $\overline{CLK}$ signals, respectively. The CLK and $\overline{CLK}$ signals also clock the cancellation circuit 322 during the normal mode of operation. Thus, during the normal mode of operation, the voltage-boosting stages 304 and 306 and the cancellation circuit 322 operate in response to the CLK and $\overline{CLK}$ signals to generate the pumped output voltage $V_P$ on the output node 310 in the same manner as previously described with reference to FIG. 1.

When the pumped output voltage $V_P$ becomes greater than the desired voltage $V_{PD}$, the charge pump circuit 300 commences operation in the power-savings mode of operation. In response to the pumped output voltage $V_P$ becoming greater than the desired voltage $V_{PD}$, the ratio circuit 334 generates the ratio voltage $V_{RP}$ having a value that is greater than the reference voltage $V_R$. When the ratio voltage $V_{RP}$ is greater than the reference voltage $V_R$, the comparator 336 drives its output active high and this high output is applied through the amplifier 338 to the buffer circuit 340. In response to the amplified high output of the comparator 336, the buffer 340 drives the REGOUT signal active high. In response to the high REGOUT signal, the switching circuit 328 presents a high impedance so that the OCLK signal no longer clocks the clocking-latching circuit 330. As a result, the clocking-latching circuit 330 no longer generates the CLK and $\overline{CLK}$ signals to clock the voltage-boosting stages 304 and 306. At this point, the CLK and $\overline{CLK}$ signals remain in their previous latched states.

During the power-savings mode of operation, the active high REGOUT signal turns ON the transistor 344 coupling the gate of the transistor 320 to approximately ground through the load transistor 342 and activated transistor 344. As a result, in the charge pump circuit 300 the transistor 320 in the final voltage-boosting stage 306 is turned OFF during the power-savings mode of operation regardless of the level of the boosted gate signal $V_{BG}$ from the cancellation circuit 322, as will now be described in more detail. As previously described, the cancellation circuit 322 generates the boosted gate signal $V_{BG}$ responsive to the CLK and $\overline{CLK}$ signals. Thus, the level of the signal $V_{BG}$ is determined by the latched state of the CLK and $\overline{CLK}$ signals when the charge pump circuit 300 enters the power-savings mode of operation responsive to the REGOUT signal going active high. More specifically, if the CLK and $\overline{CLK}$ signals are latched high and low, respectively, then the boosted gate signal $V_{BG}$ remains low during the power-savings mode. In this situation, the transistor 320 would normally be turned OFF, but this is now ensured by the isolation circuit 302 driving the gate of the transistor 320 to ground and thereby isolating the output node 310 so that the ripple of the pumped output voltage $V_P$ is not affected by the voltage on the node 316.

If the CLK and $\overline{CLK}$ signals are latched low and high, respectively, upon entering the power-savings mode, the cancellation circuit 322 attempts to drive the boosted gate signal $V_{BG}$ high. In the charge pump circuit 300, however, the isolation circuit 302 is turned ON in the power-savings mode responsive to the active high REGOUT signal. More specifically, the transistor 344 turns ON and the isolation circuit 302 presents approximately the resistance of the load transistor 342 between the gate of the transistor 320 and ground. The relatively small resistance of the load transistor 342 presents a large load on the output of the cancellation circuit 322, thereby driving the output of the cancellation circuit 322 and thus the gate of the transistor 320 low. Therefore, although the cancellation circuit 322 would normally apply a high signal $V_{BG}$ to turn ON the transistor 320 in this situation, the isolation circuit 302 drives the gate of the transistor 320 low to ensure that the transistor is turned OFF.

In the charge pump circuit 300, the isolation circuit 302 turns OFF the transistor 320 isolating the output node 310 from the node 316 so that the pumped output voltage $V_P$ is unaffected by the voltage on the node 316 independent of the state of the latched CLK and $\overline{CLK}$ signals when the power-savings mode is entered. In this way, the voltage on the node 316 does not increase the ripple of the pumped output voltage $V_P$ during the power-savings mode. Thus, relative to conventional charge pump circuits, the charge pump circuit 300 may operate with a lower power consumption and a lower voltage ripple of the voltage $V_P$ during the power savings mode of operation. In the charge pump circuit 300, the isolation circuit 302 controls the final voltage-boosting stage 306 to reduce the ripple of the voltage $V_P$. One skilled in the art will realize, however, a separate isolation circuit could be utilized to isolate the output node 310 from the final voltage-boosting stage. For example, the final voltage-boosting stage could include a diode-coupled transistor and a separate isolation circuit could then be coupled between the output of this final stage and the node 310 and operate responsive to the REGOUT signal.

Once the pumped output voltage $V_P$ becomes less than the desired voltage $V_{PD}$, the feedback control circuit 332 drives the REGOUT signal inactive low and the charge pump circuit 300 once again commences operation in the normal mode. Note that when the REGOUT signal goes inactive low, the transistor 344 turns OFF causing the isolation circuit 302 to present a high impedance to the gate of the transistor 320 so that the level of the boosted gate signal $V_{BG}$ from the cancellation circuit 322 controls the operation of the transistor 320 during the normal mode.

Figure 4:
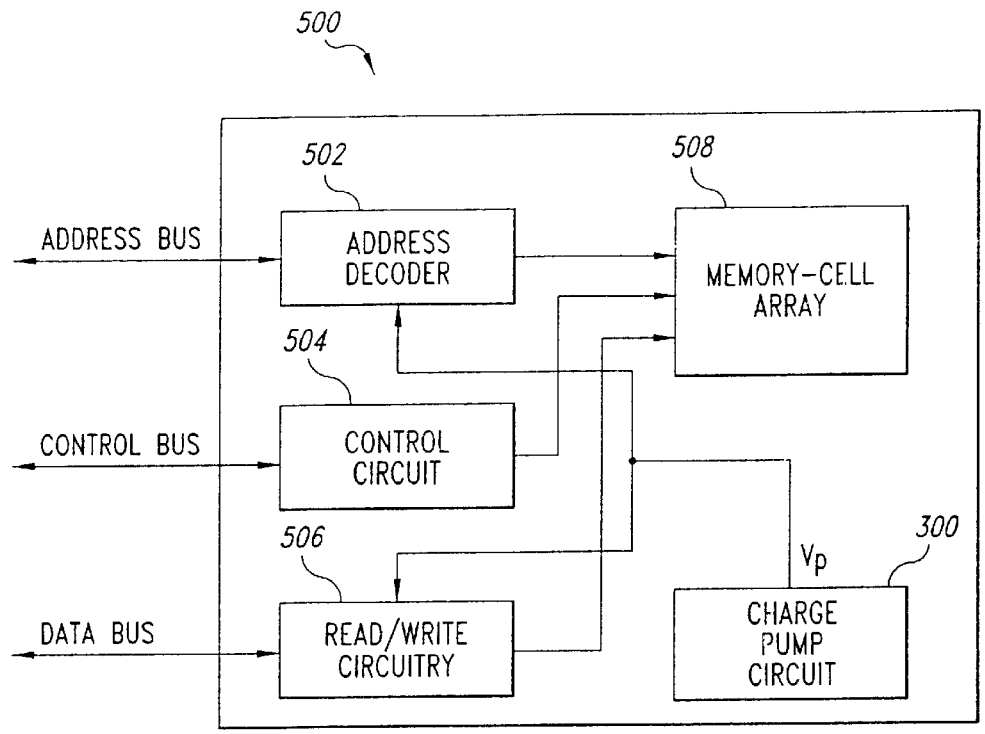
FIG. 4 is a functional block diagram of a memory device including the charge pump circuit of FIG. 3.

FIG. 4 is a block diagram of a dynamic random access memory ("DRAM") 500 including the charge pump circuit 300 of FIG. 3. The DRAM 500 includes an address decoder 502, control circuit 504, and read/write circuitry 506 coupled to a memory-cell array 508, all of these components being conventional. In addition, the address decoder 502 is coupled to an address bus, the control circuit 504 is coupled to a control bus, and the read/write circuitry 506 is coupled to a data bus. The pumped output voltage $V_P$ generated by the charge pump circuit 300 may be applied to number of components within the DRAM 500, as understood by those skilled in the art. In the DRAM 500, the charge pump circuit 300 applies the pumped output voltage $V_P$ to the read/write circuitry 506 that may utilize this voltage in a data buffer (not shown) to enable that buffer to transmit or receive full logic level signals on the data bus. The charge pump circuit 300 also applies the pumped output voltage $V_P$ to the address decoder 502 which, in turn, may utilize this voltage to apply boosted word line voltages to the array 508. In operation, external circuitry, such as a processor or memory controller, applies address, data, and control signals on the respective busses to transfer data to and from the DRAM 500.

Although the charge pump circuit 300 is shown in the DRAM 500, one skilled in the art will realize the charge pump circuit 300 may be utilized in any type of integrated circuit requiring a pumped voltage, including other types of nonvolatile and volatile memory devices such as FLASH memories as well as SDRAMs, SRAMS, and packetized memory devices like SLDRAMs. When contained in a FLASH memory, the charge pump circuit 300 would typically receive an external programming voltage $V_{PP}$ and generate a boosted programming voltage that is utilized to erase the data stored in blocks of nonvolatile memory cells contained in the array 508, as will be understood by one skilled in the art.

Figure 5:
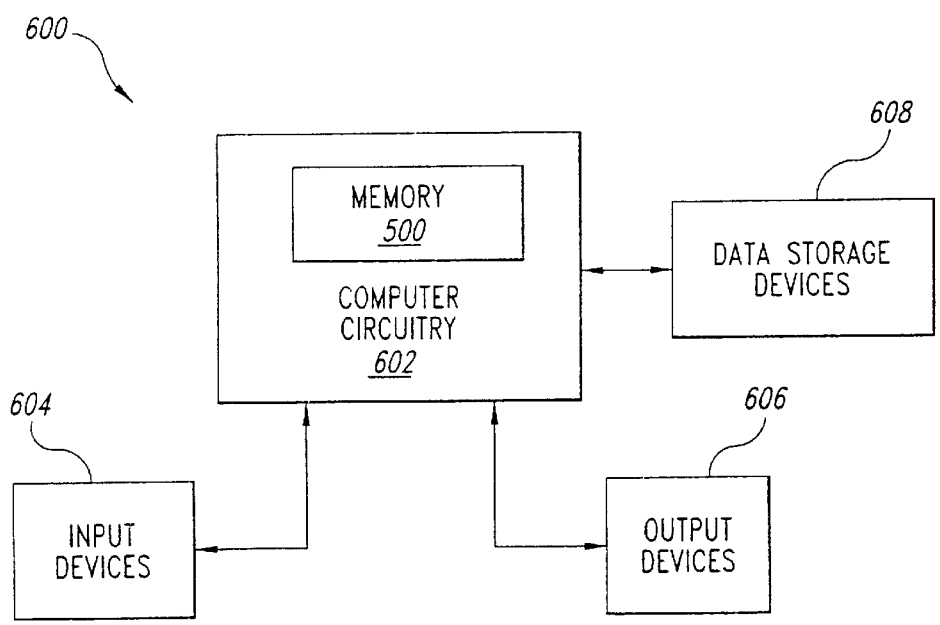
FIG. 5 is a functional block diagram of a computer system including the memory device of FIG. 4.

FIG. 5 is a block diagram of a computer system 600 including computing circuitry 602 that contains the memory device 500 of FIG. 4. The computing circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or a video terminal. One or more data storage devices 608 are also typically coupled to the computer circuitry 602 to store data or retrieve data from external storage media (not shown). Examples of typical storage devices 608 include hard and floppy disks, tape cassettes, and compact disc read-only memories (CD-ROMs). The computer circuitry 602 is typically coupled to the memory device 500 through appropriate address, data, and control busses to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A method of controlling a charge pump circuit to generate a pumped voltage, the charge pump circuit including a plurality of voltage-boosting stages connected in series, the method comprising:
   coupling the final voltage-boosting stage to a pumped output node;
   controlling the voltage-boosting stages to generate a pumped voltage on the pumped output node; and
   isolating the final voltage-boosting stage from the pumped output node responsive to the pumped voltage being greater than a desired value.

2. The method of claim 1 wherein coupling the final voltage-boosting stage to a pumped output voltage node comprises activating the final voltage-boosting stage of the charge pump circuit.

3. The method of claim 1 wherein isolating the final voltage-boosting stage from the pumped output voltage node responsive to the pumped voltage being greater than a desired value comprises deactivating the final voltage-boosting stage independent of the act of controlling the voltage-boosting stages to generate a pumped voltage on the pumped output voltage.

4. A method of controlling a charge pump circuit to generate a pumped voltage, the charge pump circuit including a plurality of voltage-boosting stages connected in series, the method comprising:
   coupling the final voltage-boosting stage to a pumped output node;
   controlling the voltage-boosting stages to generate a pumped voltage on the pumped output node;
   monitoring a value of the pumped voltage;
   in response to the monitored value of the pumped voltage being greater than a threshold value,
      controlling the voltage-boosting stages to stop generating the pumped voltage, and
      isolating the final voltage-boosting stage from the pumped output node.

5. The method of claim 4 wherein coupling the final voltage-boosting stage to a pumped output voltage node comprises activating the final voltage-boosting stage of the charge pump circuit.

6. The method of claim 4 wherein pumped voltage has a positive value.

7. A method of sequentially pumping charge from one node to an adjacent node in a series of connected nodes to generate a pumped voltage on an output node corresponding to a final node in the series, the method comprising:

pumping charge from each odd node in the series to the next adjacent even node;

pumping charge from each even node in the series to the next adjacent odd node;

pumping charge from the even or odd node adjacent the output node to the output node to develop the pumped voltage on the output node;

monitoring a value of the pumped voltage;

when the monitored value of the pumped voltage has a magnitude greater than a threshold value, terminating the pumping of charge from the even or odd node adjacent the output node to the output node and terminating the pumping of charge from each odd node in the series to the next adjacent even node and the pumping of charge from each even node in the series to the next adjacent odd node; and when the monitored value of the pumped voltage has a magnitude less than or equal to the threshold value, pumping charge from the even or odd node adjacent the output node to the output node and pumping charge from each odd node in the series to the next adjacent even node, and pumping charge from each even node in the series to the next adjacent odd node.

8. A charge pump circuit for generating a boosted voltage, comprising:

a pumping circuit including a plurality of voltage-boosting stages coupled in series, each voltage-boosting stage having a clock terminal adapted to receive a clock signal and operable to generate a boosted voltage responsive to the clock signal, with a final voltage-boosting stage in the series further including a control terminal that receives a disable signal and operates to disable operation of the final voltage-boosting stage responsive to the disable signal; and a control circuit coupled to the control terminal, the control circuit generating the disable signal responsive to the boosted voltage generated by the final voltage-boosting stage being greater than a pumped value.

9. The charge pump circuit of claim 8, further comprising a switching circuit coupled between the control terminal of the final voltage-boosting stage and the control circuit, and the switching circuit operable to apply a reference voltage on the control terminal to activate the disable signal responsive to a regulation control signal.

10. The charge pump circuit of claim 9 wherein the switching circuit comprises a load transistor having a first signal terminal coupled to the control terminal of the final voltage-boosting stage and an enable transistor coupled between a second signal terminal of the load transistor and a reference voltage source, the enable transistor having a control terminal coupled to receive the regulation control signal.

11. The charge pump circuit of claim 8 wherein each voltage-boosting stage comprises a transistor having signal terminals coupled between an input node and an output node, and a capacitor having a first terminal coupled to the input node and a second terminal adapted to receive the corresponding clock signal.

12. The charge pump circuit of claim 11 wherein each transistor comprises an NMOS transistor.

13. The charge pump circuit of claim 8 wherein a ring oscillator clocks odd voltage-boosting stages of the pumping circuit with a first clock signal and clocks even voltage-boosting stages of the pumping circuit with a second clock signal that is the complement of the first clock signal.

14. A charge pump circuit for generating a boosted voltage, comprising:

a pumping circuit including a plurality of voltage-boosting stages coupled in series, each voltage-boosting stage including an input node and an output node and having a clock terminal adapted to receive a clock signal, and each voltage-boosting stage being operable responsive to the clock signal to pump charge from the input node to the output node, a final voltage-boosting stage in the series further including a control terminal that receives a disable signal, the final voltage-boosting stage being operable to pump charge from the corresponding input node to the corresponding output node responsive to the disable signal being inactive and being operable to isolate the input node from the output node responsive to the disable signal being active; and a control circuit coupled to the control terminal, the control circuit operable to drive the disable signal inactive responsive to the boosted voltage generated by the final voltage-boosting stage being less than or equal to a pumped value and operable to drive the disable signal active responsive to the boosted voltage being greater than the pumped value.

15. The charge pump circuit of claim 14, further comprising a switching circuit coupled between the control terminal of the final voltage-boosting stage and the control circuit, and the switching circuit operable to apply a reference voltage on the control terminal to activate the disable signal responsive to a regulation control signal.

16. The charge pump circuit of claim 15 wherein the switching circuit comprises a load transistor having a first signal terminal coupled to the control terminal of the final voltage-boosting stage and an enable transistor coupled between a second signal terminal of the load transistor and a reference voltage source, the enable transistor having a control terminal coupled to receive the regulation control signal.

17. The charge pump circuit of claim 14 wherein each voltage-boosting stage except the final voltage-boosting stage comprises a transistor having signal terminals coupled between the corresponding input and output nodes and a capacitor having a first terminal coupled to the corresponding input node and a second terminal adapted to receive the corresponding clock signal.

18. The charge pump circuit of claim 14 wherein the final voltage-boosting stage comprises a transistor having signal terminals coupled between the corresponding input node and an interim node, and includes a capacitor having a first terminal coupled to the corresponding input node and a second terminal adapted to receive the corresponding clock signal, and wherein the final voltage-boosting stage further comprises an isolation switch coupled between the interim node and the corresponding output node and includes a control terminal adapted to receive the disable signal, the isolation switch operable to couple the interim node to the output node responsive to the disable signal being inactive and operable to isolate the interim node from the output node responsive to the disable signal being active.

19. The charge pump circuit of claim 14 wherein the final voltage-boosting stage comprises a transistor having signal terminals coupled between the corresponding input and output nodes and a capacitor having a first signal terminal coupled to the corresponding input node and a second signal terminal adapted to receive the corresponding clock signal, and having a control terminal adapted to receive the disable signal.

20. The charge pump circuit of claim 19 wherein the inactive disable signal comprises a pumped voltage and wherein the active disable signal comprise a signal having a value causing the transistor to turn off and isolate the input and output nodes.

21. The charge pump circuit of claim 20 wherein the transistor comprises an NMOS transistor.

22. The charge pump circuit of claim 14 wherein a ring oscillator clocks odd voltage-boosting stages of the pumping circuit with a first clock signal and clocks even voltage-boosting stages of the pumping circuit with a second clock signal that is the complement of the first clock signal.

23. A charge pump circuit for generating a boosted voltage, comprising:

a plurality of voltage-boosting stages coupled in series and each voltage-boosting stage having a clock terminal adapted to receive a clock signal and generating a boosted voltage responsive to the clock signal;

an isolation circuit coupled between a final voltage-boosting stage in the series and an output node on which the boosted voltage is generated, the isolation circuit including a control terminal adapted to receive a disable signal and being operable to apply an interim boosted voltage generated by the final voltage-boosting stage on the output node as the boosted voltage in response to the disable signal being inactive, and operable to isolate the final voltage-boosting stage from the output node responsive to the disable signal being active; and a control circuit coupled to the control terminal, the control circuit generating the active disable signal responsive to the boosted voltage on the output node being greater than a desired value.

24. The charge pump circuit of claim 23 wherein the isolation circuit comprises a transistor.

25. The charge pump circuit of claim 23 wherein the isolation circuit comprise an additional voltage-boosting stage including a transistor having a first signal terminal coupled to the output node and a second signal terminal coupled to the final voltage-boosting stage, the transistor receiving the disable signal on a control terminal, and the isolation circuit further including a capacitor having a first terminal coupled to the second signal terminal and a second terminal adapted to receive the clock signal.

* * * * *

UNITED STATES PATENT AND TRADEMARK OFFICE
CERTIFICATE OF CORRECTION

PATENT NO.   : 6,549,474 B2
DATED        : April 15, 2003
INVENTOR(S)  : Tz-yi Liu It is certified that error appears in the above-identified patent and that said Letters Patent is hereby corrected as shown below:

<u>Title page,</u>
Item [56], References Cited, OTHER PUBLICATIONS, "Choi et al." reference "Electronics Co., Ltd, Kiheung," should read -- Electronics Co., Ltd., Kiheung, --; "Mihara et al.," reference ""Negative Heap Pump" should read -- "Negative Heat Pump --; and "Hyogo Japan," should read -- Hyogo, Japan, --; "Sawada" reference "et al., An On-Chip High Voltage Genreator Circuit for EEPROMs with a Power Supply Voltage below 2V, in" should read -- et al., "An On-Chip High-Voltage Generator Circuit for EEPROMs with a Power Supply Voltage Below 2V, in" --; "256k X 8 Boot Block Flash Memory, in Micron " should read -- 256k X 8 Boot Block Flash Memory," in Micron --

<u>Column 1,</u>
Line 29, "$V_{CC}$,and a negative" should read -- $V_{CC}$, and a negative --

<u>Column 2,</u>
Lines 43-44, "108 and the have assumed values" should read -- 108 have assumed values --
Line 55, "as the capacitor 10 is being" should read -- as the capacitor 110 is being --

<u>Column 3,</u>
Line 54, "since OCLK signal" should read -- since the OCLK signal --

<u>Column 6,</u>
Line 3, "voltage cancellation circuit." should read -- voltage cancellation circuits.--
Line 45, "such as two resisters" should read -- such as two resistors --

<u>Column 10,</u>
Line 64, "wherein pumped voltage" should read -- wherein the pumped voltage --

<u>Column 13,</u>
Line 1, "signal comprise a signal" should read -- signal comprises a signal --

UNITED STATES PATENT AND TRADEMARK OFFICE
CERTIFICATE OF CORRECTION

PATENT NO. : 6,549,474 B2
DATED : April 15, 2003
INVENTOR(S) : Tz-yi Liu

It is certified that error appears in the above-identified patent and that said Letters Patent is hereby corrected as shown below:

<u>Column 14,</u>
Line 13, "isolation circuit comprise" should read -- isolation circuit comprises --

Signed and Sealed this

First Day of June, 2004

JON W. DUDAS
*Acting Director of the United States Patent and Trademark Office*